US007741921B2

(12) United States Patent
Ismailov

(10) Patent No.: US 7,741,921 B2
(45) Date of Patent: Jun. 22, 2010

(54) TRIGGER-MODE DISTRIBUTED WAVE OSCILLATOR SYSTEM

(75) Inventor: Damir Ismailov, Houston, TX (US)

(73) Assignee: Waveworks, Inc., Mission Viejo, CA (US)

( * ) Notice: Subject to any disclaimer, the term of this patent is extended or adjusted under 35 U.S.C. 154(b) by 142 days.

(21) Appl. No.: 12/151,344

(22) Filed: May 5, 2008

(65) Prior Publication Data
US 2009/0273403 A1 Nov. 5, 2009

(51) Int. Cl.
*H03L 7/24* (2006.01)

(52) U.S. Cl. .............................. 331/55; 331/46; 331/50; 331/57; 331/96; 331/99; 331/117 D; 331/172

(58) Field of Classification Search ................... 331/46, 331/50, 55, 57, 96, 99, 117 D, 172
See application file for complete search history.

(56) References Cited

U.S. PATENT DOCUMENTS

| | | | |
|---|---|---|---|
| 2,691,099 A | 10/1954 | Lien | |
| 2,735,941 A | 5/1956 | Peck | |
| 3,516,021 A | 6/1970 | Kohn | |
| 4,568,889 A | 2/1986 | Bayraktaroglu | |
| 4,686,407 A | 8/1987 | Ceperley | |
| 4,749,963 A | 6/1988 | Makimoto et al. | |
| 5,584,067 A | 12/1996 | Buer et al. | |
| 5,640,112 A | 6/1997 | Goto et al. | |
| 6,342,820 B1 | 1/2002 | Leyten et al. | |
| 6,396,359 B1 | 5/2002 | Hajimiri et al. | |
| 7,161,438 B2 | 1/2007 | Wood | |
| 7,242,272 B2 | 7/2007 | Ham et al. | |
| 7,274,262 B2 * | 9/2007 | Ham et al. | 331/99 |
| 7,307,483 B2 * | 12/2007 | Tzartzanis et al. | 331/57 |
| 7,545,225 B2 * | 6/2009 | Beccue | 331/57 |
| 7,609,756 B2 * | 10/2009 | Wood | 331/17 |
| 2003/0076178 A1 * | 4/2003 | Aikawa et al. | 331/55 |
| 2005/0093637 A1 * | 5/2005 | Hajimiri et al. | 331/107 DP |
| 2006/0071844 A1 * | 4/2006 | Wood | 341/172 |
| 2006/0097803 A1 * | 5/2006 | Wood | 331/57 |

* cited by examiner

*Primary Examiner*—Arnold Kinkead
*Assistant Examiner*—Richard Tan
(74) *Attorney, Agent, or Firm*—Oktay Enterprises Int'l., LLC; Sevgin Oktay

(57) ABSTRACT

A Trigger-Mode Distributed Wave Oscillator that provides accurate multiple phases of an oscillation and a method of use of the same. An auxiliary oscillator triggers an oscillation on independent conductor loops or rings forming a differential transmission medium for the oscillation wave. Once the oscillation wave is triggered, the auxiliary oscillator can be powered down to turn it off, and the wave can sustain itself indefinitely through active amplifying devices which can compensate for losses in the conductors.

19 Claims, 7 Drawing Sheets

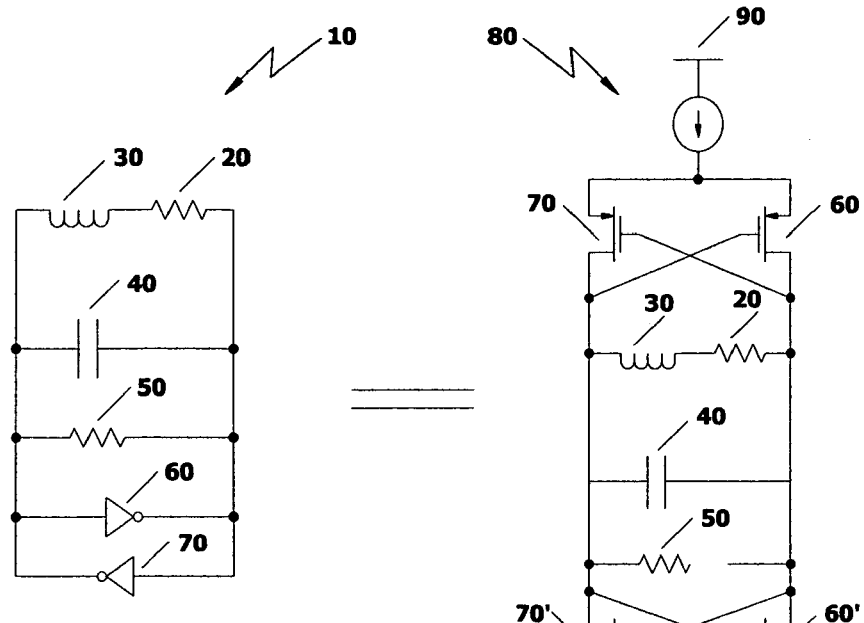
Prior Art- Fig. 1a
Prior Art- Fig. 1b
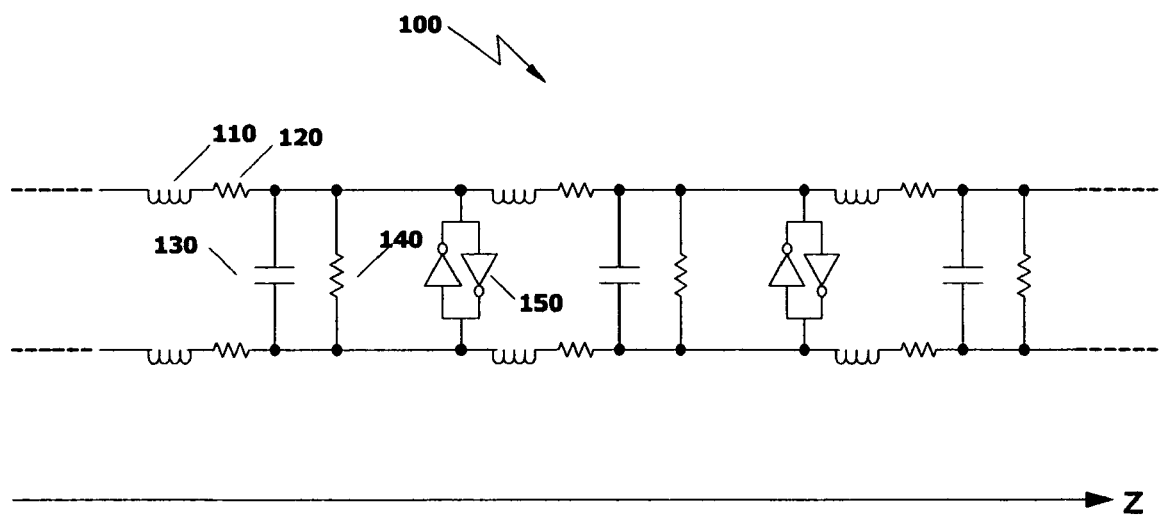
Prior Art- Fig. 2

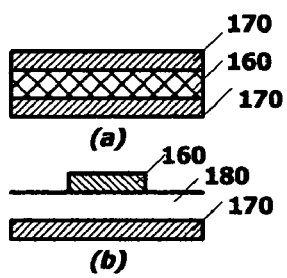
Prior Art- Fig. 3
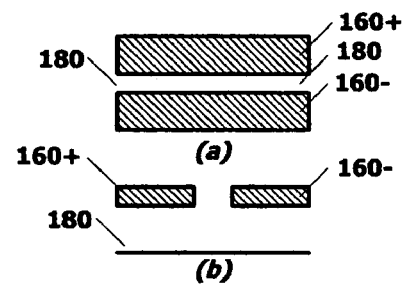
Prior Art- Fig. 4
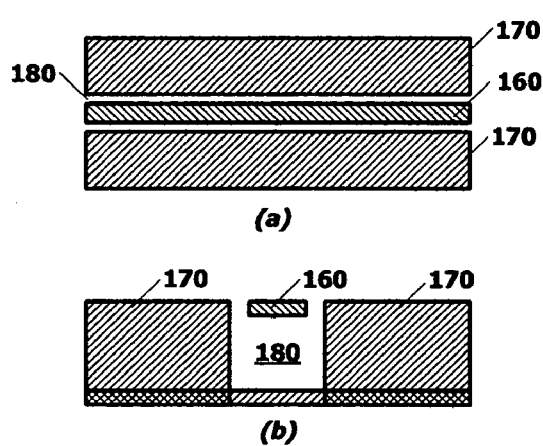
Prior Art- Fig. 5
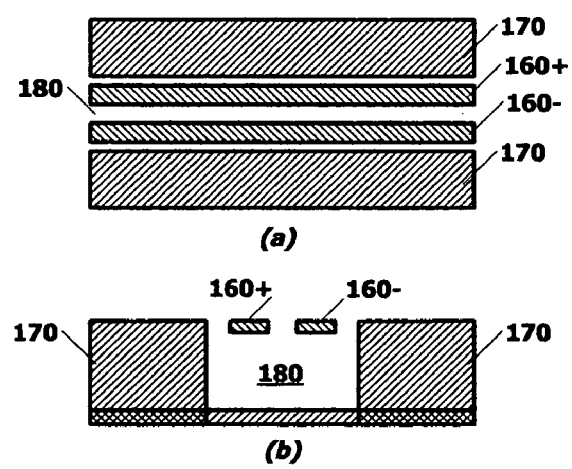
Prior Art- Fig. 6

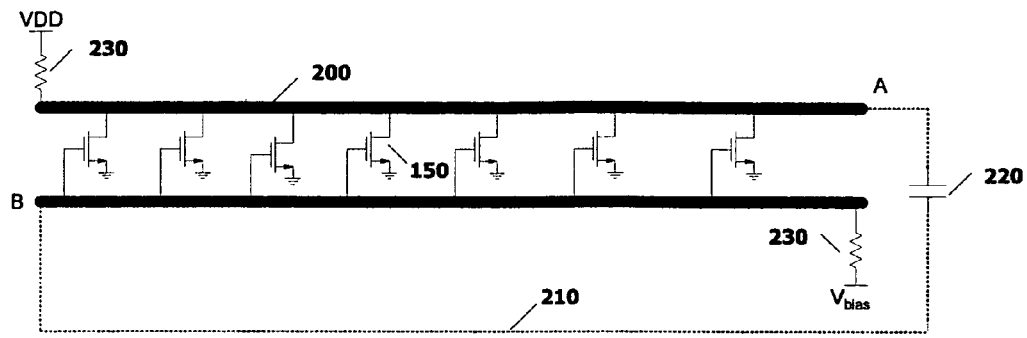
*Prior Art - Fig. 7*
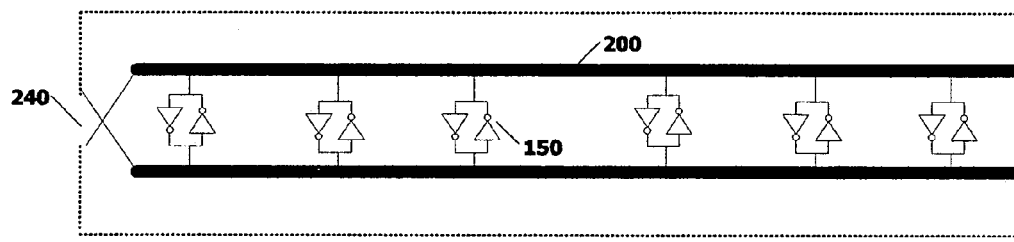
*Prior Art - Fig. 8*
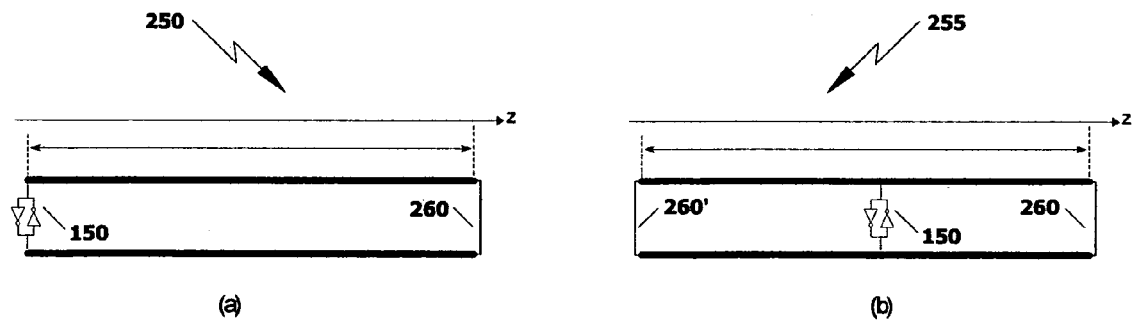
*Prior Art - Fig. 9*

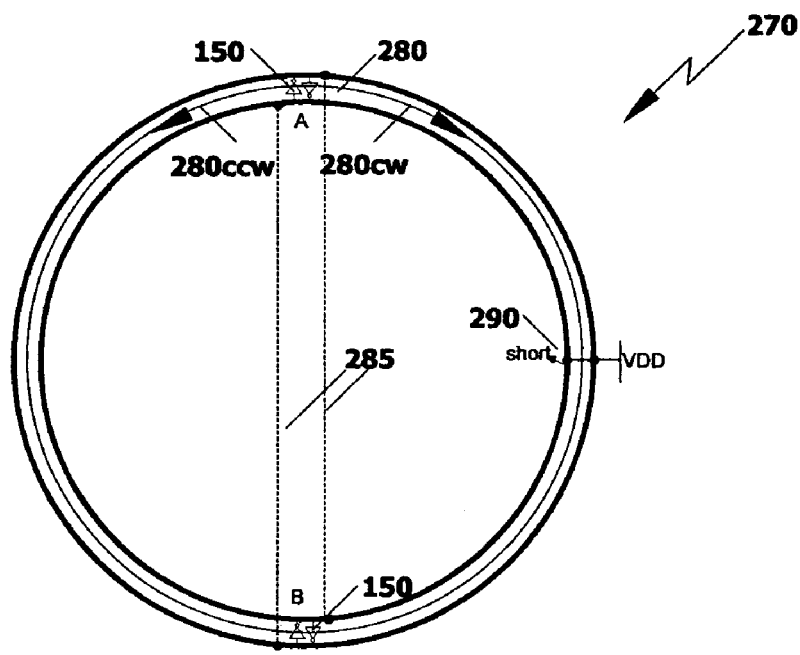
*Prior Art - Fig. 10a*
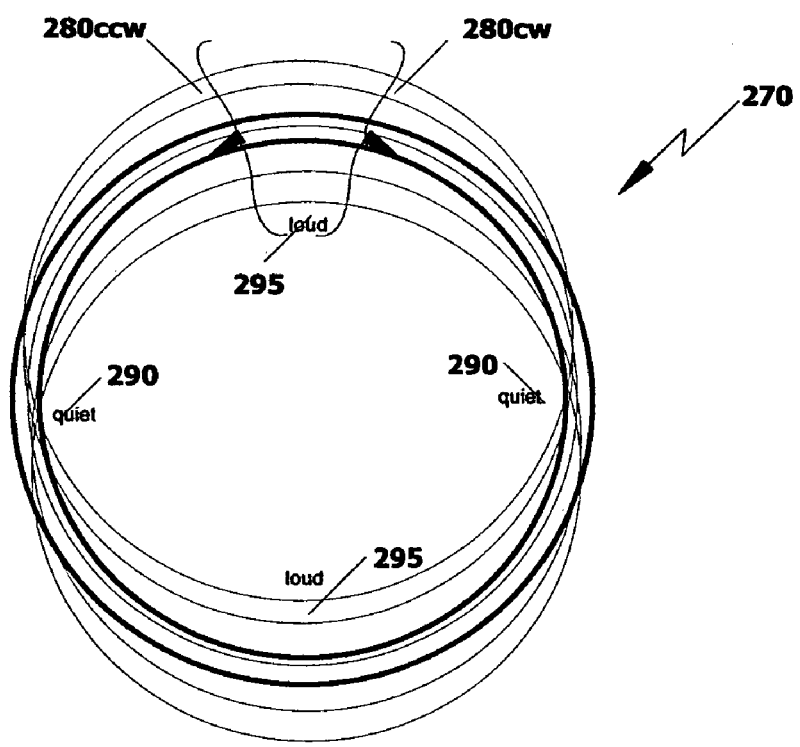
*Prior Art - Fig. 10b*

US 7,741,921 B2

TRIGGER-MODE DISTRIBUTED WAVE OSCILLATOR SYSTEM

BACKGROUND

All references cited in this specification, and their references, are incorporated by reference herein where appropriate for teachings of additional or alternative details, features, and/or technical background.

Disclosed is an electronic oscillator system that provides accurate multiple phases of an oscillation. Oscillation, in electrical sense, can be defined as repetitive variation of voltage or current in time, which can then be used as signals to accomplish certain tasks, say in electronic devices such as mobile phones. Though prior art is abound with many different types of multiple-phase oscillators used as a source of timing signals for many electronic systems such as microprocessors, network processors, wireline/wireless transceivers and other data communication circuits, they generally suffer from unwanted irregularities in the amplitude and/or frequency of these signals. Even the slightest irregularities may become quite significant in very high-frequency high-accuracy type electronic circuitry. The presently disclosed traveling distributed wave oscillator can mitigate not only these types of unwanted discrepancies, but it can also sustain the oscillations indefinitely by a judicious use of an auxiliary oscillator as described later in the embodiments of a trigger-mode distributed wave oscillator.

Generally, there are two main types of electronic oscillators that produce repetitive electronic signals: the harmonic oscillator and the relaxation oscillator. The harmonic oscillator produces a sinusoidal output. The basic form of a harmonic oscillator is an electronic amplifier with the output attached to a narrow-band electronic filter, and the output of the filter attached to the input of the amplifier. When the power supply to the amplifier is first switched on, the amplifier's output consists only of noise. The noise travels around the loop, being filtered and re-amplified until it increasingly resembles the desired signal. The relaxation oscillator is often used to produce a non-sinusoidal output, such as a square wave or sawtooth. The oscillator contains a nonlinear component such as a transistor that periodically discharges the energy stored in a capacitor or inductor, causing abrupt changes in the output waveform. Square-wave relaxation oscillators can be used to provide the clock signal for sequential logic circuits such as timers and counters, while the sawtooth oscillators can be used in the time-based circuits that generate the horizontal deflection signals for cathode ray tubes in analogue oscilloscopes and television sets.

Most conventional electronic oscillator circuits use two reactive components, an inductor and a capacitor to create a resonant circuit, in an ideal case indefinitely transferring the energy from one to the other. However, in reality, the loss mechanisms associated with these reactive devices (can be modeled as resistance (R) and/or transconductance (G) elements) require active amplifying circuitry to compensate for these losses. The classical implementation for such an active compensation circuit is negative resistance circuit formed by cross-coupled active devices. A well-known MOSFET (Metal-oxide Semiconductor Field Effect Transistor) implementation of this configuration is shown in FIGS. 1a-1b and FIG. 2. The resultant oscillation frequency is given by the well-known relationship, $$f_{osc} = \frac{1}{2\pi\sqrt{LC}},$$

where L is the inductance of inductor 30 and C is the capacitance of capacitor 40 of the so-called L-C tank oscillators 10 and 80 shown in FIGS. 1a-1b. The parasitic resistance R 20 associated with inductor 30 and the parasitic conductance G 50 associated with capacitor 40 results in losses in the tank-oscillators 10 and 80 of FIGS. 1a-1b, respectively that need to be compensated through cross-coupled inverting amplifiers 60 and 70 shown in the same FIGS. 1a-1b. In a CMOS (Complementary Metal-Oxide Semiconductor) technology, an inverting amplifier is implemented by connecting the drains and gates of a PMOS and an NMOS transistor together, resulting in a well-known oscillator circuit 80 shown in FIG. 1b, where 90 provides power supply potential ($V_{DD}$). The devices 70 and 70' of circuit 80 in FIG. 1b correspond to the inverting amplifier 70 of circuit 10 in FIG. 1a, whereas the devices 60 and 60' of circuit 80 in FIG. 1b correspond to the inverting amplifier 60 of circuit 10 in FIG. 1a.

Since the transmission lines are effectively distributed LC structures, distributed LC-oscillators can be constructed using transmission lines of which FIG. 2 is exemplary. A transmission line is, in general, parallel running conductors separated by a dielectric material. Micro-strip line (FIGS. 3a-b), coplanar wave guide (FIGS. 4a-b), coplanar strip line (FIGS. 5a-b), and differential coplanar wave guide (FIGS. 6a-b) are some of the most common transmission line structures. (Similar numerals refer to similar parts shown in FIG. 3-6. Thus 160, 170, 180 refer to respective signal lines, ground planes and dielectric layers separating the signal layer from the ground plane. Positive and negative signal lines are designated as 160⁺ and 160', respectively. Similarly, character (a) references top-view, while character (b) references cross-sectional views of the respective transmission line structures in FIGS. 3-6). Although any of these structures can be used to construct an oscillator, the differentially symmetric ones are more favorable since the opposite phases of a signal are already available (coplanar strip line and differential coplanar wave guide).

Oscillator 100 in FIG. 2 shows an electrical model for a differential transmission line. In the same figure, 110 is inductance of $L_o$dz/2 where $L_o$ is inductance per unit length, 120 is resistance of $R_o$dz where $R_o$ is resistance per unit length, 130 is differential capacitance of $C_o$dz where $C_o$ is capacitance per unit length and 140 is differential conductance of $G_o$dz where $G_o$ is differential conductance per unit length for a differential transmission line stretching in z direction. The inductance per unit length and capacitance per unit length determine the phase velocity of the propagating wave. The phase velocity of a wave is given $$v = 1/\sqrt{L_O C_O}$$

where $L_o$ and $C_o$ are inductance per unit length and capacitance per unit length, respectively. Then, for a given total length of transmission line, the oscillation frequency can be calculated to be $$f_{osc} = \frac{1}{\sqrt{L_{tot}C_{tot}}},$$

where $L_{tot}$ and $C_{tot}$ are the total inductance and total capacitance along the transmission line. As described before, cross-coupled active amplifiers 150 are used to compensate for the conductor and substrate losses. Thanks to the distributed nature of these transmission line oscillators, multiple phases of an oscillation are available along the transmission line, whereas only two 180 deg opposite phases are available in case of a lumped L-C tank oscillators. Distributed Wave Oscillators, Rotary Traveling or Distributed Wave Oscillators, Standing Wave Oscillators are different classes of existing transmission line based oscillators all utilizing the distributed L-C nature of a transmission line structure.

FIG. 7 shows a simplified distributed oscillator of transmission line type 200 with characteristic impedance of $Z_o$. The actual shape can be in any closing geometric form bringing point A to the vicinity of point B so that dashed AC coupled connection 210 can be obtained using a capacitor $C_{bp}$ 220. The reflections resulting from the mismatch of the biasing resistor, $R_{match}$ 230 to the line impedance, $Z_0$, can be significant source of disturbance in the steady-state oscillation waveforms. This affect together with an additional non-ideality due to the bypass capacitor $C_{bp}$ are the main drawbacks of this oscillator technique.

Another transmission line oscillator approach, Rotary Traveling Wave Oscillator technique shown in FIG. 8, avoids this disadvantage by direct cross-coupling 240 of the end points with an additional cost of odd symmetry introduced by this crossing of the transmission lines. The single-wire closed-loop structure of a Rotary Traveling Wave Oscillator limits the disturbances to one crossover which can still be significant at especially high-frequencies. Once enough gain is provided, there is no latch-up danger for the technique; since it utilizes a single-line DC-coupled closed-loop structure.

Standing Wave Oscillators (SWO) are another group of transmission line oscillators that would utilize transmission line structures. As is known by those skilled in the art, standing waves are formed by superimposing the forward and the backward distributed waves on the same transmission medium simultaneously. The two basic Standing Wave Oscillator topologies, quarter-wave λ/4 SWO 250 and half-wave λ/2 SWO 255 are shown in FIGS. 9a-b, respectively. A λ/2 SWO is basically combination of two λ/4 SWOs around a center symmetry point, with fundamental operating principle staying the same. In this type of oscillators, the differential transmission line structure is driven by cross-coupled amplifier 150 pair at one end, whereas the other end 260 is shorted. The waves created at the amplifier end 150 are reflected back at the short end 260 causing a reverse propagating wave along the transmission line. In the steady state, the forward and reverse waves coexist, creating standing wave along the line. This would imply amplitude variations in the oscillation phases along the line, gradually diminishing and eventually reaching zero at the short end 260'.

Circular Standing Wave Oscillator (CSWO) 270, shown in FIGS. 10a-10b, is still another standing wave type that would not require any reflection mechanism, but, rather a circular symmetry to create reverse propagating waves along the transmission line medium. As shown in FIG. 10a, the energy is injected into a closed-loop transmission line structure equally and travels symmetrically along the ring in clockwise 280cw and counter-clockwise 280ccw directions. These counter-traveling waves create standing waves with an amplitude profile as shown in FIG. 10b. It will be noted that where the wave components cancel each other a "quiet" node 290 is formed and a "loud" node 295, when the wave components reinforce each other. The energy is injected at two opposite points (A and B) with additional dashed connections 285 to force the main mode. Additionally, at least one of the quiet ports 290 has to be shorted to prevent any latch-up problems. This reduces this structure also to a single-line structure.

It will be known to those skilled in the art that conventional Standing Wave Oscillator structures have a critical drawback of amplitude variations which permits their usage to a limited set of applications. The oscillation phases corresponding to the quite ports would not even exist, compromising the main advantage of transmission line oscillators. What is needed, therefore, is an electronic oscillator circuitry that can provide invariant multiple phases of an oscillation in an uninterrupted manner.

REFERENCES

U.S. Pat. No. 7,242,272 discloses methods and apparatus involving semiconductor devices based on coplanar strip lines (CPS). In one example, high-speed microelectronic devices based on coplanar stripline implementations support differential signals in a range of approximately from 1 Gigahertz to at least 60 Gigahertz. In one aspect, CPS-based devices incorporate various features that increase the quality factor Q of the resulting device. In another aspect, an enhancement of the quality factor Q is achieved while at the same time reducing the phase velocity of one or more waves propagating in the device, thereby also facilitating the fabrication of relatively smaller devices. In still another aspect, a tapered coplanar stripline configuration results in position-dependent line parameters, which may be exploited to achieve significantly high-Q devices. Examples of CPS-based devices incorporating such features include impedance matching devices, devices for power combining and division, delays, resonators, oscillators, filters, amplifiers, mixers and the like, including CMOS-based implementations of such devices.

U.S. Pat. No. 7,161,438 describes an electronic circuitry for generating and distributing standing wave clock signals. The electronic circuitry includes one or more two-conductor transmission line segments that are interconnected with an odd number of voltage-reversing connections to form a closed loop. A regeneration device is connected between the conductors of the transmission line segments and operates to establish and maintain a standing wave on the loop. At any location on a segment there is a pair of oppositely phase oscillations.

U.S. Pat. No. 5,640,112 teaches A clock signal distributing system supplies clock signals exhibiting extremely matched phases as a standing wave without employing extra signals such as a reference signal and the like other than clock signal itself. The system compensates for a phase lag in clock signal sand attenuation in signal amplitude. As a result, clock signals exhibiting extremely matched phases are supplied up to the places to be distributed at the respective terminals without requiring equal-length wiring on, for example, a semiconductor chip. The clock signal distributing system is composed of an electromagnetic transmission path line which transmits periodic clock signals as a standing wave, an amplifier, and a phase advancing unit which advances phases of the periodic clock signals wherein a phase lag in transmission of clock signals and a phase lag in amplitude of the amplifier are corrected in the phase advancing direction by the phase advancing unit.

U.S. Pat. No. 5,584,067 discloses a dual traveling wave resonator filter including a microstrip line to receive an input signal at a first end and first and second traveling wave resonator rings. Each traveling wave resonator ring is in close proximity to the microstrip line such that first and second resonant first combined signals are induced, respectively, in each of the first and second traveling wave resonator rings in response to the input signal on the microstrip line. A bandreject signal is rejected from the microstrip line and a passband signal is produced from the microstrip line at a second end.

U.S. Pat. No. 4,749,963 shows a high frequency oscillator comprising a ring type inductive resonator of a microstrip line constituted in a rectangular or annular loop. Capacitors are serially connected to both ends of the line, thereby improving the low-noise, separation and stability characteristics by use of the steep-phase characteristic of the ring-shaped resonator.

U.S. Pat. No. 4,686,407 teaches an improved traveling wave ring resonator utilizing only one source of waves. The standard traveling wave ring resonator uses two wave sources phased 90 degrees apart and physically separated by a quarter wavelength to separately excite two equal-frequency standing wave modes which make up a traveling wave. The present invention uses perturbations of the ring resonator to shift the frequency of the standing wave modes, by specified amounts, and to correctly fix their position, to allow a single wave source to properly excite the standing wave modes which comprise a traveling wave. This invention has application to traveling wave ring resonators in acoustics, mechanical devices, and electromagnetic devices, as well as to simply-connected resonators to be excited in rotating wave modes. Specific applications include improved thermoacoustic traveling wave heat engines and pumps, simplified surface wave motors, and energy efficient wave pools for recreational purposes.

U.S. Pat. No. 6,342,820 describes a balanced oscillator comprising a frequency selective circuit and a balanced active circuit coupled with the frequency selective circuit. The frequency selective circuit includes a short circuited quarter-wave paired line. The balanced active circuit comprises a cross coupled differential pair of transistors. The balanced oscillator can be tuned in a number of different ways.

U.S. Pat. No. 6,396,359 teaches techniques and structures for a tunable, distributed, voltage-controlled oscillator (DVCO) across a wide range of microwave frequencies. One type of DVCO implements a tuning circuit that includes a pair of interconnected amplifying transistors and a current source connected to the transistors, such that a differential voltage input to the circuit adjusts the current to each transistor and effectively adjusts the "electrical length" of one of the transmission lines on which the output frequency is oscillating. This, in turn, adjusts the time delay and thus frequency of the signal propagating on the lines across a wide frequency band. In a preferred embodiment, the tuning circuit is balanced with a complementary tuning circuit to effectively adjust the electrical length of the second transmission line in the oscillator. In another technique that provides for coarser, but wider range broadband frequency tuning, the time delay, and thus, frequency, of the DVCO is adjustable by varying the capacitive loading on the transmission lines, by introducing a coupling capacitor between the transmission lines and tuning the intrinsic capacitances of the gain transistors with a dc bias input.

SUMMARY

Aspects disclosed herein include an electronic system comprising an electronic medium having one or more independent electrical conductors; one or more oscillation triggering circuitry, the triggering circuitry configured to inject oscillations into the electrical conductors; a plurality of cross-coupled amplifiers distributed along the electrical conductors; an oscillation detecting circuitry configured to detect the oscillations in the electrical conductors, wherein the oscillation detector is capable of restarting the triggering circuitry if any disruptions in the oscillations are detected; and wherein said oscillation triggering circuitry is capable of being turned-off without affecting the sustained oscillations indefinitely.

a trigger-mode distributed wave oscillator comprising an electronic medium having two independent conductor loops performing the function of two identical transmission lines; an auxiliary oscillator, the auxiliary oscillator configured to trigger to inject into said independent electrical conductor loops opposite oscillation phases in order to enable each one of the independent electrical conductors to use the other as a booster to sustain the oscillation even after the auxiliary oscillator is turned-off; a finely distributed plurality of cross-coupled amplifiers distributed along the electrical conductors configured to amplify any weak oscillations due to losses in the conductors; a finely distributed plurality of varactors configured to vary the capacitance of the transmission lines in order to tune the frequency of traveling the distributed wave for phase-locked loop conditions; an oscillation detecting circuitry configured to detect the oscillation in the electrical conductors, wherein the oscillation detector is capable of restarting the auxiliary oscillator in order to re-trigger the oscillation if any disruptions in the oscillation are detected; and wherein the auxiliary oscillator is capable of being turned-off without affecting the sustained oscillation indefinitely.

a method comprising the steps of providing a trigger-mode distributed wave oscillator system having at least two or more conducting transmission lines forming two or more independent loops, one or more auxiliary trigger oscillators, one or more oscillation detectors; a plurality of cross-coupled amplifiers and varactors distributed uniformly along the loops; powering-up the auxiliary trigger oscillators; triggering the auxiliary trigger oscillators to inject a plurality of phase oscillations at a triggering oscillation frequency into phase nodes along the independent loops; ramping up supply voltage for the cross-coupled amplifiers; detecting the phase oscillations in the oscillation detectors; and shutting down the auxiliary oscillators.

BRIEF DESCRIPTION OF DRAWINGS

FIGS. 1a and 1b show a conventional Lumped L-C tank oscillator.

FIG. 2 shows a conventional Distributed Oscillator structure using transmission lines.

FIGS. 3-6 show top and cross-sectional views of conventional semiconductor devices comprising a Microstrip line, a Coplanar Wave Guide, a Coplanar Strip Line and a Differential Coplanar Wave Guide, respectively.

FIG. 7 shows a conventional Distributed Oscillator Structure.

FIG. 8 shows a conventional Rotary Traveling Wave Oscillator.

FIGS. 9a and 9b show a conventional quarter-wave and a half-wave Standing Wave Oscillator, respectively.

FIGS. 10a and 10b show a conventional quarter-wave and a half-wave Circular Standing Wave Oscillator structure, and amplitude profile along the structure, respectively.

DETAILED DESCRIPTION

In embodiments there is illustrated an electronic oscillator system comprising a plurality of independent conductor rings or loops forming a differential transmission medium for sustaining indefinitely a multi-phase oscillation wave triggered by an auxiliary oscillator. Once the oscillation wave is triggered, the auxiliary oscillator can be powered down to turn it off, and the wave can sustain itself continuously through active amplifying devices which can compensate for losses in the conductors.

In one embodiment, the auxiliary oscillator of the disclosed electronic circuitry triggers an oscillation in at least two independent conductor loops, similar to triggering two identical transmission lines with opposite oscillation phases so that each one of these independent lines can use the other one as the booster to sustain the oscillation even after the triggering medium is removed. It will be appreciated by those skilled in the art that although the triggering medium disclosed here is an auxiliary oscillator as described below, other mechanisms may also be used to trigger the oscillation.

Generally, it is an accepted practice to use single loop oscillators because, contrary to the present disclosure described in more detail below, known art teaches that if more than one loop is attempted, a latch-up will occur, and oscillation will not take place. However, single loops themselves are commonly susceptible to well-known problems caused by asymmetric disturbances due to variances in the nature and number of components, such as amplifiers, terminators and varactors associated with the functionality of the oscillators. On the other hand, the present disclosure teaches anew that a plurality of loops comprising one or more symmetrically independent transmission lines can indeed be used to advantage as a well-behaved oscillator by bringing forward their strengths in eliminating any asymmetric disturbances by virtue of their symmetry with respect to each other, and also by their interactive characteristics to boost each other independently to sustain the wave energy indefinitely even after the auxiliary oscillator is shut down, as described further below. According to the teachings of the present disclosure, the expected latch-up of multiple loops is circumvented by the use of an auxiliary triggering oscillator which triggers the loops into action without the occurrence of a latch-up.

Figure 11:
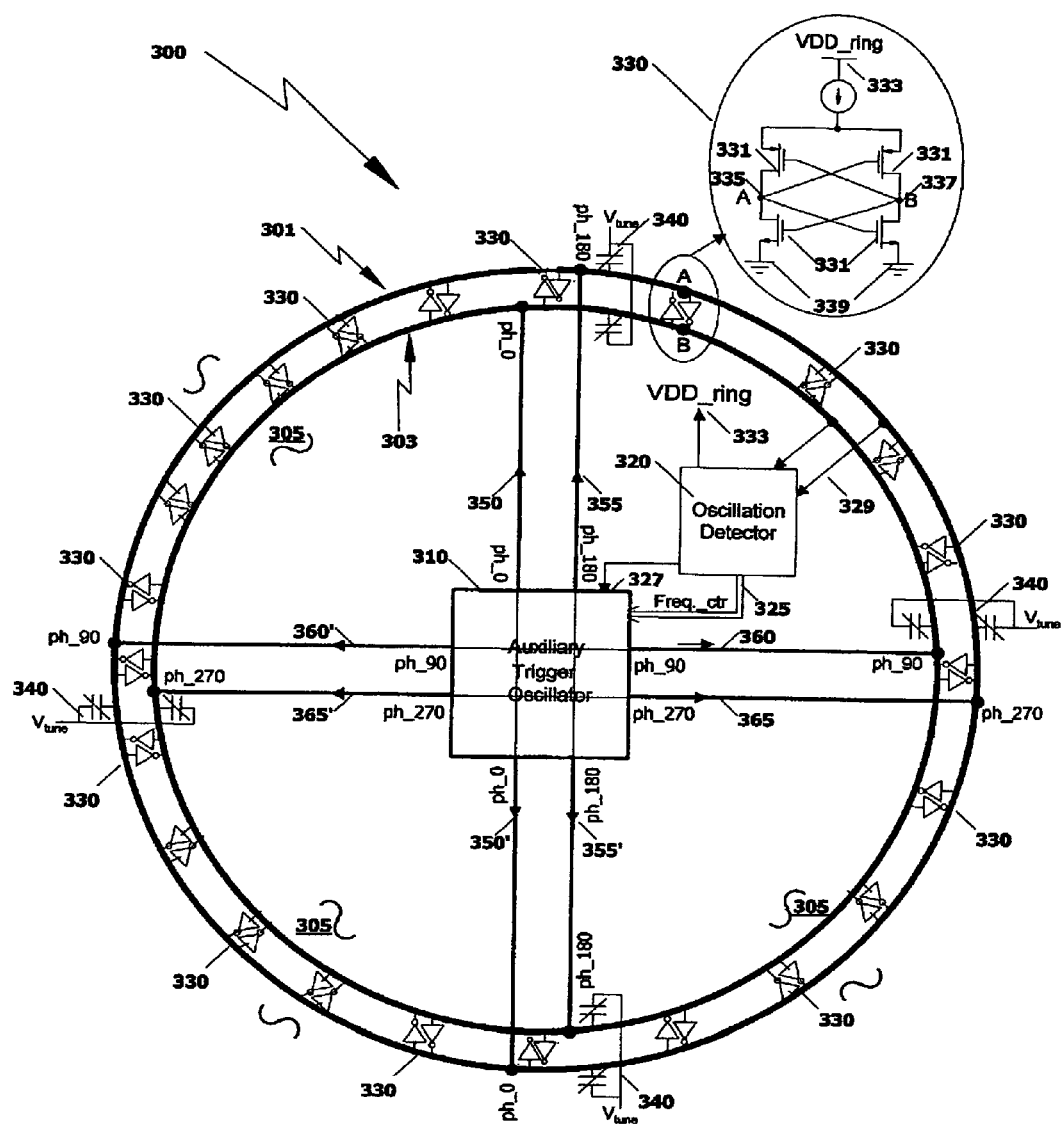
FIG. 11 shows diagrammatically an embodiment of the presently disclosed Trigger-Mode Distributed Wave Oscillator having an auxiliary Trigger Oscillator, having finely distributed plurality of cross-coupled amplifiers, varactors and an Oscillation Detector.

FIG. 11 is illustrative of at least a 4-phase trigger-mode traveling or distributed wave oscillator system 300 having at least two independent transmission lines 301 and 303 formed in the form of a ring, or any symmetric geometrical form, in medium 305. In one aspect of the present disclosure, a four stage differential ring Voltage-Controlled Oscillator (VCO) is used as a triggering auxiliary oscillator 310. It will be understood by those skilled in the art that other types of oscillators may be used as a triggering circuitry or device, such as a quadrature LC-tank VCO, or other 8, 16 or other multi-phase oscillators.

In one aspect, and in accordance with the present disclosure, while the auxiliary oscillator 310 triggers and injects multi-phase oscillations into the trigger-mode distributed wave oscillator system 300 as described further below, any weak injection oscillation is amplified by cross-coupled amplifiers 330 during the power-up, thus preventing any latch-up. After a successful trigger mode, an oscillation detector 320 detects the presence of the oscillations and powers down the triggering auxiliary oscillator 310 to save power. Thereafter, the resultant distributed traveling wave sustains itself unless a long-lasting power failure causes it to latch-up. In the case of such an occasion resulting in a latch-up, the Oscillation Detector 320 reinitiates the start-up sequence to rebuild the oscillations.

In another aspect, the quadrature phases shown in FIG. 11 (see also FIGS. 12a-b) comprise four phases of ph0, ph90, ph180 and ph270 as denoted by reference numerals 350, 355, 360 and 365, respectively, routed to their corresponding locations along transmission lines 301, 303 in medium 305 with a ring of any symmetrical closed shape, including a triangle, a square, or an octagon, for example. Opposite phases, which are described later, are also shown with reference numerals 350', 355', 360' and 365'. It will be understood that an oscillator with 8, 16 or more number of phases can also be used for this purpose, routing the available phases to their corresponding locations along the transmission ring medium 305. Energy is injected into the closed-loop transmission lines 301 and 303 equally at uniformly distributed points 330 and travels symmetrically along the ring 305 in a preferred clockwise or counter-clockwise direction as determined by the triggering phases. Energy is provided by VDD-ring 333 and injected at points A 335 and B 337.

In still another aspect, the order of phase connections determines the direction of the resultant traveling wave. Also, if an opposing phase is used at every injection point, the direction of the resulting traveling wave is reversed. In accordance with the present disclosure, a preferred direction is forced by means of an initial triggering that causes the energy to travel in the desired direction.

In another embodiment, the triggering is applied in a symmetrically distributed fashion by connecting the triggering phases to the actual symmetric physical locations on the transmission line ring corresponding to these phases and the amplifiers 330 in FIG. 11 are also finely distributed in a substantially symmetric fashion, resembling a distributed LC structure with a fine resolution. In practice, the resolution and the symmetry that a particular physical design can achieve has direct influence on the amplitude and timing accuracy of the resulting phase. Consequently, for such a symmetrical and distributed structure, there is not any source of reflection or any distinctive preferred way for the energy to split. Hence, in one aspect, the proposed triggering mechanism of the present disclosure can serve another purpose, namely, setting the direction for the traveling wave. This is accomplished by forcing the wave to travel in the direction imposed by the auxiliary trigger oscillator. The wave in a TMDWO is forced into distributed traveling mode rather than standing mode. Standing wave oscillation generally is not a preferred mode of operation due to severe amplitude variations in the oscillation phases. The distributed varactors 340 shown in FIG. 11 constitute a fraction of the total capacitance on the line providing a tuning range for the Trigger-Mode Distributed Wave Oscillator of the present disclosure, and hence enabling its use in phase-locked loops (PLLs). In order to lock the oscillation to a nominally specified reference frequency, phase-locked loops require a certain amount of tuning range from about 10% to about 50% depending upon the manufacturing process tolerances of the oscillator to be locked. The control voltage, Vtune, feeding into the finely distributed varactors, 340 in FIG. 11, adjusts the total amount of capacitance on the line to tune the frequency of the traveling wave.

In operation, an oscillation is triggered in two independent transmission lines 301 and 303 of the Trigger-Mode Distributed Wave Oscillator System 300 in FIG. 11, each carrying opposite phases of the oscillation 350, 355, 360, 365 and 350', 355', 360', 365', respectively, at any distribute location 330 along the parallel running differential transmission lines 301 and 303. The waves traveling on these two independent lines 301 and 303 posses the same propagation characteristics since the lines and the loading corresponding to each line are identical and symmetric. Once successfully created by the auxiliary trigger oscillator 310, the opposite phases 350, 355, 360, 365 and 350', 355', 360', 365', respectively, of the traveling wave oscillation propagate indefinitely together with the aid of cross coupled amplifiers 330 which are finely distributed along the lines 301 and 303 compensating for the losses. It will be noted that the oscillation phases are not limited only to one set of phases as one can tap to any phase of an oscillation along the ring. Cross-coupled amplifier unit cells 330 are distributed in a symmetric fashion resulting in a smooth traveling wave without any amplitude or phase distortion. If symmetry is abandoned by placing additional amplifiers at certain locations along a loop (ring)—which in turn would cause a delay in the passage of the wave due to an increase in the load capacitance at those locations—the phase and amplitude accuracy of the phases would be degraded. Nevertheless, if as a result, the oscillation detector detects any stoppage in the oscillation, it would restart the auxiliary oscillator. In the absence of such imbalances in normal operations, inverting amplifiers in 330 use the signal in one of the lines 301 or 303 as booster for the opposing phase traveling in the other line 301 or 303. However, the difficulty arises with the initial existence of these opposite oscillation phases 350, 355, 360, 365 and 350', 355', 360', 365' in the two independent identical lines 301 and 303. Since the constituent transmission lines are two independent conductors, there is no mechanism to guarantee traveling wave build-up every time. Thus, during the power-up, the system could latch-up even before any oscillation build-up (i.e. one of the lines could be pulled up to VDD-ring 333 and the other one to GND-ring 339 in the amplifier cell 330 due to the cross-coupled amplifiers 331). However, such a condition can be circumvented according to the present disclosure described hereafter.

Figure 12A:
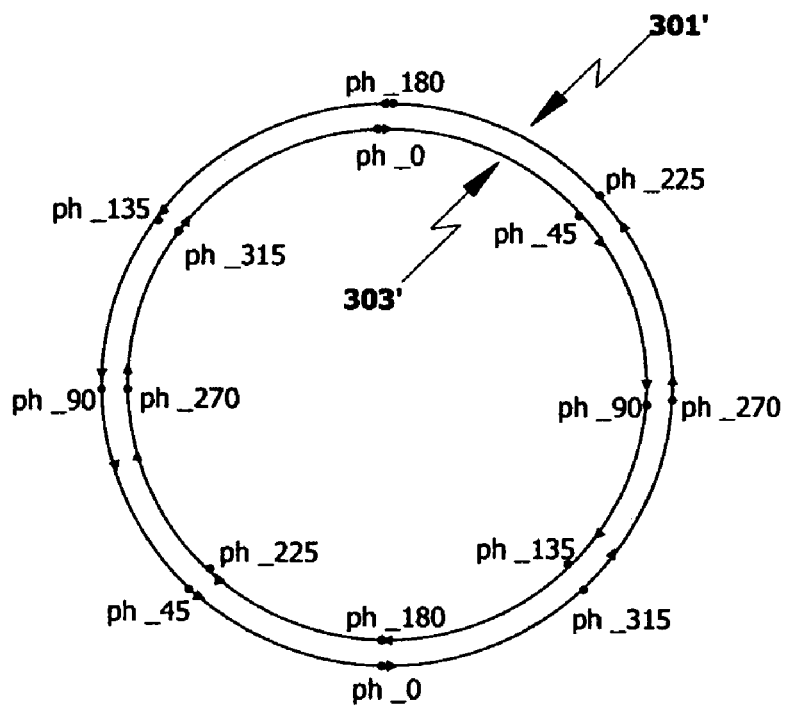
FIGS. 12a and 12b show diagrammatically opposite wave propagation in the conductors of the presently disclosed Trigger-Mode Distributed Wave Oscillator and the time domain representation of some of the oscillation phases on the conductors, respectively.
Figure 12B:
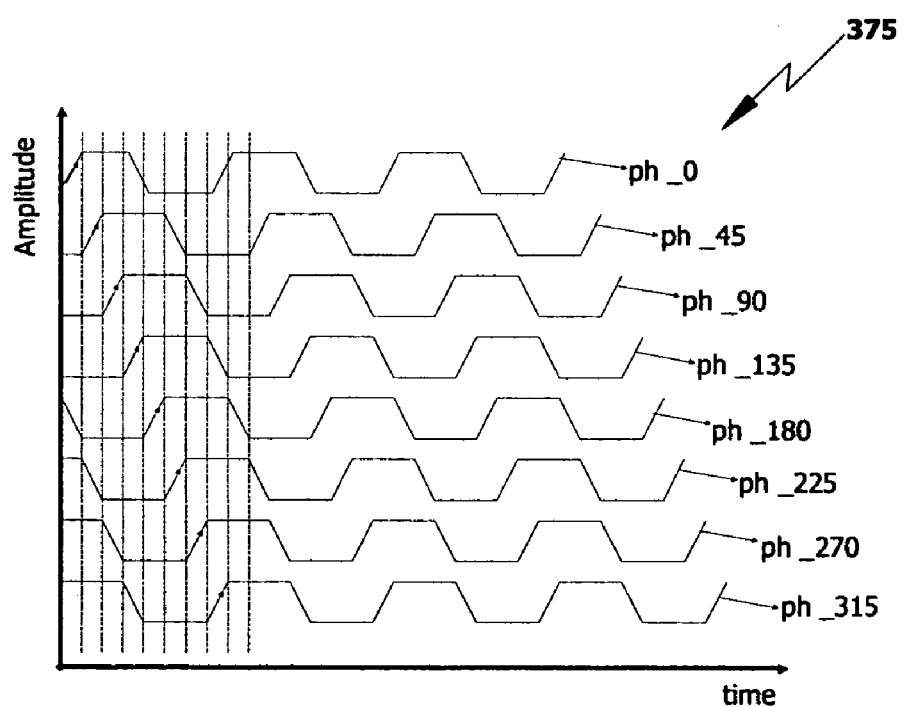

In another aspect of the disclosed Trigger-Mode Distributed Wave Oscillator, the absence of wave build-up condition is overcome by using the auxiliary oscillator 310 shown in FIG. 11, which injects multiple opposite phases into the corresponding phase locations along the ring during the power-up. This also ensures an oscillation only in fundamental mode. It will be known to those skilled in the art that the structure shown in FIG. 11 can also oscillate at higher harmonics of the fundamental frequency (multiple wave cycles that can exist in the same lap). However, applying the triggering injection in the fundamental mode frequencies, as well as the additional losses associated with high frequencies prevent high order oscillation modes. The closed shape of these parallel running differentially triggered transmission lines 301 and 303, which is shown to be circular in FIG. 11, can take any closed geometric form such as square, triangle, rectangle, octagon, circle, each having symmetrical injection points corresponding to the available triggering phases. (It will be noted that any geometrical variations in the leg lengths and angles, say, of a triangular loop, as dictated by other considerations will degrade the phase accuracy. However, this can be compensated for by compensatory phase delays introduced by the auxiliary oscillator). FIGS. 12*a-b* show the direction of the resulting opposite traveling waves 301' and 303' as well as the time domain waveforms 375 for some of the oscillation phases corresponding to the various locations along the transmission lines, say along the transmission lines 301 and 303 of FIG. 11.

An embodiment of a method of start-up sequence for a quadrature 4-phase oscillator 300 shown in FIG. 11 involves the following steps (which, it will be understood that the methodology is not limited to a quadrature oscillator and can be applied to a multi-phase oscillator):

1. power-up the auxiliary trigger oscillator 310;
2. trigger auxiliary oscillator 310, thereby injecting the required quadrature signals into the corresponding quadrature locations or nodes on the transmission line loops 301 and 303; and simultaneously
3. ramp up the supply VDD_ring 333 for the cross-coupled amplifiers 330;
4. engage oscillation detector 320 to look for oscillation build-up;
5. turn off the auxiliary oscillator 310 to save power if an oscillation is detected in medium 305;
6. if an oscillation is not detected, update the triggering frequency of the auxiliary oscillator 310 for the next level of frequencies and repeat steps 1-5 above until an oscillation build-up is achieved for continued oscillation with the auxiliary oscillator 310 is powered down.
7. if weakening followed by stoppage of the oscillation is detected, the oscillation detector 320 restarts the sequence by repeating the steps 1-6 stated above.

In one aspect, step 6 above is repeated sweeping the triggering frequency in a range wider than the estimated wave oscillation frequency, and once an oscillation is detected, the triggering auxiliary oscillator is powered down to conclude the start-up sequence. It will be understood that during normal operation, oscillation detector 320 remains on in order to detect the integrity of the on-going oscillation. If for any reason, the oscillation happens to weaken to the point of not being detected, the oscillation detector 320 reinitiates the start-up sequence 1 through 5 to rebuild the oscillation.

In another aspect of the presently disclosed embodiment, the described operation involves a method where the triggering oscillation frequency is held close to the value of the actual traveling wave frequency that would be present in the transmission lines 301 and 303 of the disclosed Trigger-Mode distributed Wave Oscillator System 300 of FIG. 11. Since the parameters governing the oscillation frequencies of both oscillators 300 and 310 are dependent upon the processes used for manufacturing the oscillators, the oscillators themselves can vary considerably in their performance. In order to guarantee successful triggering for oscillators having different process properties, the triggering oscillator frequency is swept across a wide frequency range in the stated start-up sequence given above. In every sweep step, the oscillation detector 320 in FIG. 11 looks for an oscillation. In case no oscillation is detected, the detector circuit updates the triggering frequency to the next level by frequency control word, Frequency Controller 325 shown in the same FIG. 11, and restarts the supply ramp sequence. Once a successful oscillation is detected, the sweep process is terminated and the triggering oscillator 310 is powered down.

Figure 13A:
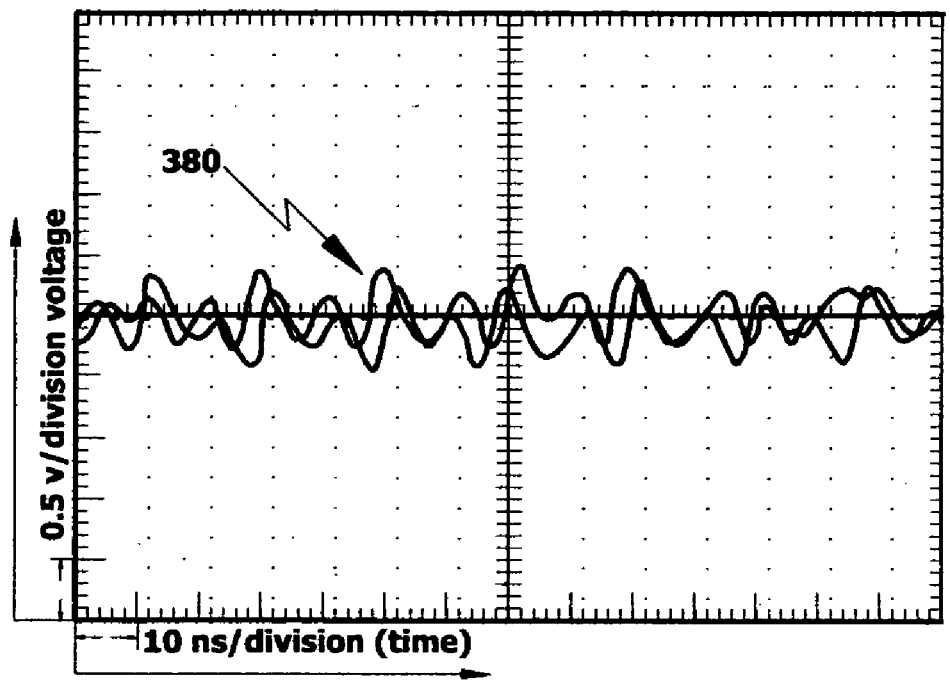
FIGS. 13a and 13b show the measured triggering wave form and the resultant oscillation waveform, respectively, obtained with the presently disclosed Trigger-Mode Distributed Wave Oscillator.
Figure 13B:
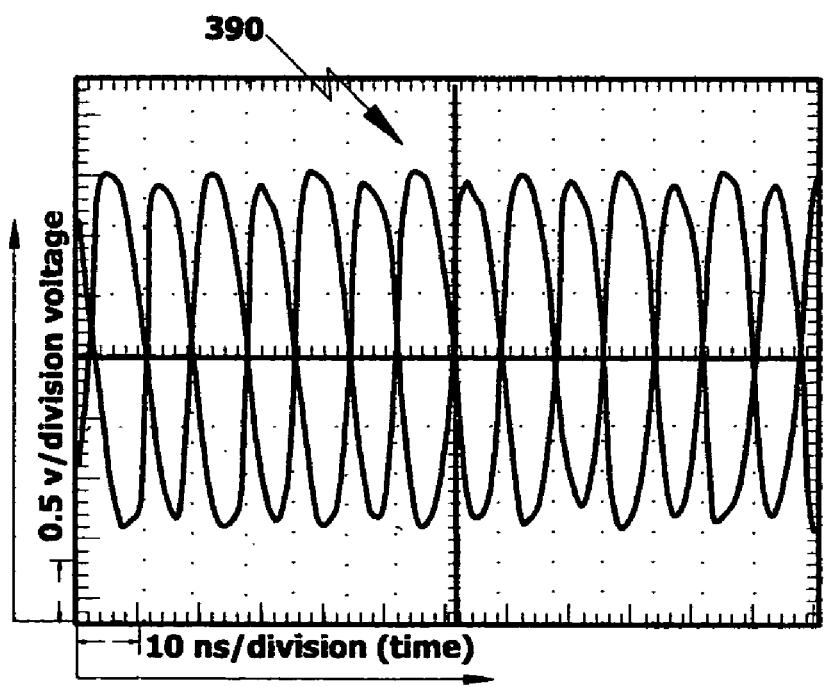

An aspect of the method of start-up sequence utilizes the generation of distributed traveling waves with frequencies ranging from about 10 MHz in printed circuit board level discrete implementations to more than 100 GHz in an integrated circuit environment. The measured triggering waveforms 380 as well as the resultant oscillation waveforms 390 of a 72 MHz board level implementation on the presently disclosed Trigger-Mode Distributed Wave Oscillator System 300 are shown in FIGS. 13a and FIGS. 13b. As predicted by the method, no oscillation was observed and the lines were latched-up (not shown) unless an injection mechanism was applied by the auxiliary trigger oscillator 310 to create an oscillation such as 390 shown in FIGS. 13b.

In another aspect, the disclosed technique that relaxes the routing requirements of the available phases in the actual physical layout can provide all of the oscillation phases in both of the two independent conductors, 301 and 303 of FIG. 11. That is, the same phase is available at the two opposite sides of oscillator 300 with respect to the axis of symmetry (e.g., ph0 can be tapped at two opposite sides of the ring, namely at 350 and 350'. It will be evident from FIG. 11 that the same is true for other phases as ph90, ph180, ph270 and ph360 that are available at 360, 360' and 355 and 355' and 365 and 365'). Hence, system 300 shown in FIG. 11 can be viewed as the triggering of two identical independent transmission line loops or rings 301 and 303 in opposite phases so that each one of them uses the other as a sustainer, resulting in two waves traveling in opposite directions with the same speed.

Though these numerous details of the disclosed method are set forth here, such as process parameters, to provide an understanding of the present disclosure, it will be obvious, however, to those skilled in the art that these specific details need not be employed to practice the present embodiments. At the same time, it will be evident that the same methods may be employed in other similar process steps that are too many to cite, such as systems having different symmetry configurations. Of the other aspects of the presently disclosed trigger-mode distributed wave oscillator that are too many to cite in great detail include the lack of any system asymmetry due to the absence of, say, odd number of line crossings or real termination impedances that may not match the line impedance accurately as is quite common conventionally. Consequently, the presently disclosed oscillator device and the method of use of the same can provide high phase accuracy at very high frequencies, which is known to be very difficult to obtain using conventional techniques with conventional devices, especially with oscillators using single loops. It should be noted that an even number of plurality of loops are expected to yield higher accuracies as they eliminate the problem of asymmetric disturbances caused by asymmetric distribution of components along a single loop out of necessity of other requirements by virtue of the inherent symmetry formed by the coupling with an additional independent loop of the same asymmetric components. Moreover, since each of the disclosed independent transmission line loops or rings (301 and 303 in FIG. 11) corresponds to a full lap of traveling around the trigger-mode oscillator loop 300 rather than half, using the same total conductor lengths 301 and 303 yields double oscillation frequency compared to what can be obtained with known distributed wave oscillators. This results in much higher frequencies than can be obtained using conventional techniques.

While the invention has been particularly shown and described with reference to a particular embodiment(s), it will be appreciated that variations of the above-disclosed embodiments(s) and other features and function, or alternatives thereof, may be desirably combined into many other different systems or applications Also that various presently unforeseen and unanticipated alternatives, modifications, variations or improvements therein may be subsequently made by those skilled in the art which are also intended to be encompassed by the following claims.

What is claimed is:

1. An electronic oscillator system comprising
   an electronic medium having one or more independent electrical conductors;
   one or more oscillation triggering circuitry, said triggering circuitry configured to inject oscillations into said electrical conductors;
   a plurality of cross-coupled amplifiers distributed along said electrical conductors;
   an oscillation detecting circuitry configured to detect said oscillations in said electrical conductors, wherein said oscillation detector is capable of restarting the triggering circuitry if any disturbances in the oscillations are detected; and
   wherein said oscillation triggering circuitry is capable of being turned-off without affecting the continuing oscillations indefinitely.

2. The device according to claim 1, wherein said oscillation triggering circuitry comprises an auxiliary four stage differential ring Voltage-Controlled Oscillator (VCO).

3. The device according to claim 1, wherein said oscillation triggering circuitry injects invariant multiple phases of an oscillation into said electrical conductors.

4. The device according to claim 1, wherein said injected oscillations are distributed symmetrically along said independent electrical conductors.

5. The device according to claim 4, wherein said independent electrical conductors carry distributed traveling waves corresponding to 180° opposite phases along said conductors.

6. The device according to claim 1, wherein said electronic device has a structure further comprising symmetrically parallel two or more running conductors of geometrical shapes configured to attain the same speed of oscillating waves in said two or more conductors.

7. A trigger-mode distributed wave oscillator comprising
   an electronic medium having at least two independent conductor loops performing the function of two identical transmission lines;
   at least one auxiliary oscillator, said auxiliary oscillator configured to trigger to inject into said independent electrical conductor loops opposite oscillation phases in order to enable each one of said independent electrical conductors to use the other as a booster to sustain said oscillation even after said auxiliary oscillator is turned-off;
   a finely distributed plurality of cross-coupled amplifiers distributed along said electrical conductors configured to amplify any weak oscillations due to losses in said conductors;
   a finely distributed plurality of varactors configured to vary the capacitance of said transmission lines in order to tune the frequency of traveling said distributed wave for phase-locked loop conditions;
   an oscillation detecting circuitry configured to detect said oscillation in said electrical conductors, wherein said oscillation detector is capable of restarting the auxiliary oscillator in order to re-trigger the oscillation if any disruptions in the oscillation are detected; and
   wherein said auxiliary oscillator is capable of being turned-off without affecting the continuing oscillation indefinitely.

8. A trigger-mode oscillator according to claim 7, wherein said auxiliary oscillator comprises a multi-stage differential ring Voltage-Controlled Oscillator (VCO).

9. A trigger-mode oscillator according to claim 7, wherein said auxiliary oscillator comprises an LC-tank VCO.

10. A trigger-mode oscillator according to claim 7, wherein said injected oscillation phases are distributed symmetrically along said independent electrical conductors.

11. A trigger-mode oscillator according to claim 7, wherein tuning range of said trigger oscillator covers the estimated frequency range of said distributed traveling wave oscillator.

12. A trigger-mode oscillator according to claim 7, wherein said trigger-mode oscillator has a structure further comprising symmetrically parallel two or more running conductors of geometrical shapes configured to attain the same propagation delay for the phases to be injected into the parallel conductors of distributed traveling wave oscillator.

13. A method comprising
providing a trigger-mode distributed wave oscillator system having at least two or more conducting transmission lines forming two or more independent loops, one or more auxiliary trigger oscillators, one or more oscillation detectors, a plurality of cross-coupled amplifiers and varactors distributed uniformly along said loops;
powering-up said auxiliary trigger oscillators;
triggering said auxiliary trigger oscillators to inject a plurality of phase oscillations at a triggering oscillation frequency into phase nodes along said independent loops;
ramping up supply voltage for said cross-coupled amplifiers;
detecting said phase oscillations in said oscillation detectors; and
shutting down said auxiliary oscillators.

14. The method according to claim 13, wherein said triggering said phase oscillations sweep a frequency range wider than that which is commensurate with manufacturing process parameters of said trigger-mode distributed wave oscillator.

15. The method according to claim 14, wherein said sweep of frequency range is repeated until a continuous oscillation of an actual traveling wave frequency is detected by said oscillation detector.

16. The method according to claim 15, wherein said triggering oscillation frequency is held close to the value of said actual traveling wave frequency of said oscillations present in said transmission lines.

17. The method according to claim 13, wherein said oscillation detector restarts said auxiliary oscillators when said oscillation detector does not detect an oscillation wave.

18. The method according to claim 13, wherein said oscillation detector restarts said auxiliary oscillators when said oscillation detector detects a weakening oscillation.

19. The method according to claim 13, wherein said oscillation detector detects the presence and strength of oscillations continuously.

* * * * *